United States Patent [19]

Ouellette

[11] Patent Number: 4,943,891
[45] Date of Patent: Jul. 24, 1990

[54] MICROELEMENT AND BASE ASSEMBLY

[76] Inventor: Alan Ouellette, 17 Graham Rd., East Hartford, Conn. 06118

[21] Appl. No.: 378,409

[22] Filed: Jul. 11, 1989

Related U.S. Application Data

[63] Continuation-in-part of Ser. No. 252,032, Sep. 28, 1988, abandoned, and a continuation-in-part of Ser. No. 122,505, Dec. 17, 1985, abandoned.

[51] Int. Cl.[5] .............................................. H05K 7/00
[52] U.S. Cl. .................................... 361/392; 174/52.4; 361/380; 361/404; 361/408; 361/417; 361/419; 439/70
[58] Field of Search .................. 174/52.4; 339/17 CF; 361/380, 392–395, 400, 404–408, 417, 418–419, 426

[56] References Cited

U.S. PATENT DOCUMENTS

| | | | |
|---|---|---|---|
| 3,573,617 | 4/1971 | Randolph | 361/418 |
| 3,825,876 | 7/1974 | Damon et al. | 174/52.4 |
| 3,846,734 | 11/1974 | Pauza et al. | 339/17 CF |
| 4,060,296 | 11/1977 | Kunkle et al. | 339/17 CF |
| 4,245,877 | 1/1981 | Auriana | 339/74 R |

FOREIGN PATENT DOCUMENTS

| | | | |
|---|---|---|---|
| 2440883 | 3/1976 | Fed. Rep. of Germany | 361/380 |
| 0013350 | 1/1984 | Japan | 339/17 CF |

*Primary Examiner*—Gregory D. Thompson
*Attorney, Agent, or Firm*—McCormick, Paulding & Huber

[57] ABSTRACT

An improved electronic circuit microelement and base assembly has a conventional microelement with a body of insulating material and a separate parallel series of terminals all projecting in the same direction. The base of the assembly is of insulating material and has a plurality of recesses each holding a lower portion of a connector engageable with a terminal. The microelement is mounted on a top surface of the base with its terminals entering the recesses and engaging their respective connectors. The connectors have portions projecting upwardly about and above the microelement body for ready engagement and connection with experimental or other wiring. All wiring connections are thus readily effected from one side of the assembly unit without reversal or "flip flopping" of the assembly.

8 Claims, 2 Drawing Sheets

U.S. Patent  Jul. 24, 1990  Sheet 2 of 2  4,943,891
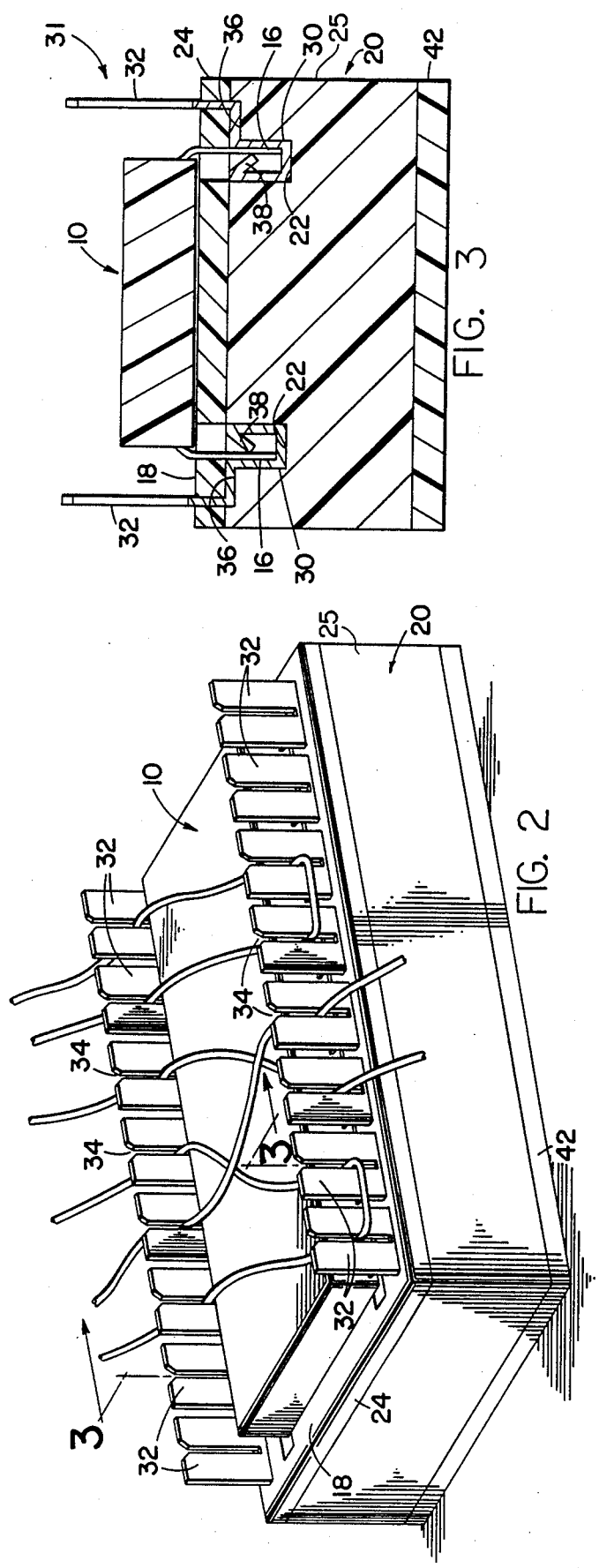
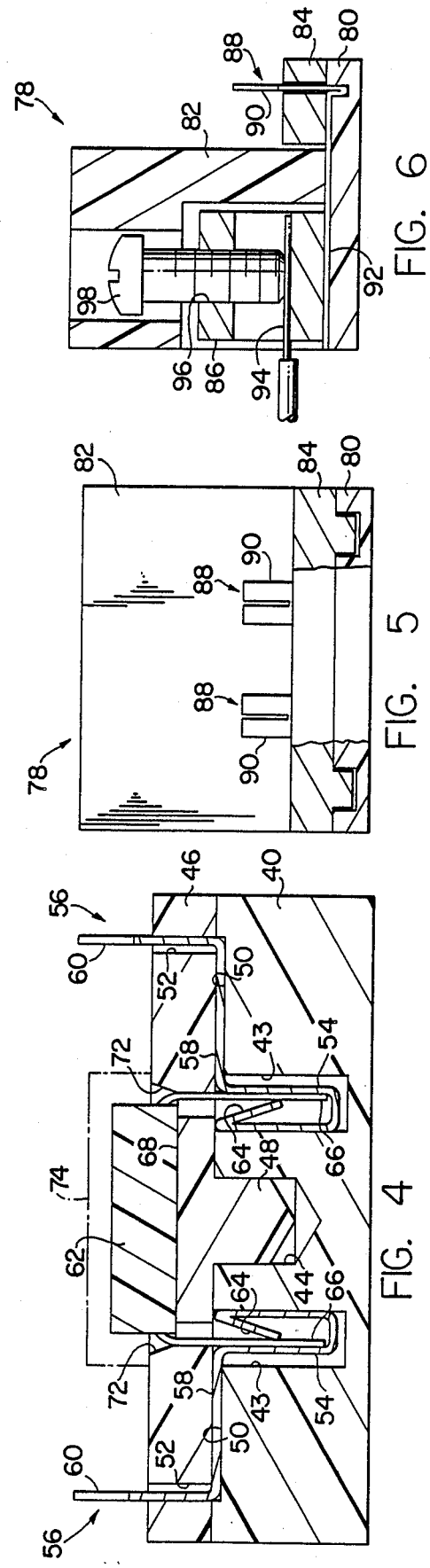

MICROELEMENT AND BASE ASSEMBLY

RELATED APPLICATIONS

This application is a Continuation In Part of application of Improved Electronic Circuit Microelement and Base Assembly filed on Sept. 28, 1988; Ser. No. 252,032, (now abandoned) Inventor, Alan Ouellette, and Continuation In Part application of Improved Electronic Circuit Microelement and Base Assembly filed on Dec. 17, 1985; Ser. No. 122,505, (now abandoned) Inventor, Alan Ouellette.

BACKGROUND OF THE INVENTION

This invention relates to the mounting of electronic circuit microelements on circuit boards and other surfaces. More particularly, the invention relates to an electronic circuit microelement and base or socket assembly wherein electrical connections can be readily made both between terminals of an electronic circuit microelement and with external electrical elements. All such connections are on one side of a circuit board and there is no passage of the terminals of the microelement or associated connectors through the circuit board as in conventional systems.

A conventional electronic circuit microelement comprises a simple rectangular parallelpiped of insulating material encapsulating the active circuit elements of the microelement. To connect the integrated circuit elements within the microelement to an external circuit, or to interconnect such elements, a plurality of electrical leads are provided through the non-conductive encapsulation or body of the microelement. The leads, conventionally projecting from a pair of opposite sides of the body of the microelement, extend outwardly in opposite directions and are bent through approximately 90° a short distance after leaving the non-conductive encapsulation or body such that all leads or terminals have free end portions extending parallel to each other. Thus, in a final configuration first and second rows or spaced parallel series of terminals or, more specifically, terminal free end portions extend a substantial distance from the body of the microelement in parallel arrangement and in the same direction.

Microelements so constructed are usually mounted directly to circuit boards by inserting the terminals in corresponding female sockets and the terminals project through the boards or, alternatively, connectors engaged by the terminals project through the boards. The opposite surface of the circuit board may include a printed circuit, and especially in experimental activities, there may be connectors which project from an opposite side of the circuit board and which are associated with the terminals of the microelement for selective interconnection and for selective external electrical connection by means of small insulated wires. That is, the connectors may be interconnected so as to interconnect their respective terminals and internal circuit elements by means of small insulated wires and/or the connectors may be employed with small diameter insulated wire to effect connections externally with other circuit elements.

Particularly in the case of experimental activities involving the use of small diameter insulated wire and wherein there may be a degree of "cut and try" technique involved, the circuit board must be continuously reversed or rotated back and forth so that the operator can properly associate the terminals of the microelement with the connectors which project from the opposite side of the circuit board, indicia usually being provided on the side of the microelement body opposite the terminals. Not only is the continuous reversal or "flip flopping" of the circuit board inconvenient and inefficient but it will be apparent that errors tend to occur in experimental wiring as a result of such an awkward and tedious technique.

It is the general object of the present invention to provide an assembly of an electronic circuit microelement and a base wherein terminal engaging connectors are provided with free end portions exposed adjacent the body of the microelement and are readily accessible on one side of the assembly, the need for reversal or "flip flopping" of a circuit board thus being wholly eliminated.

SUMMARY OF THE INVENTION

In fulfillment of the foregoing object and in accordance with the present invention, a conventional circuit microelement is provided and has a body of insulating material and a plurality of similar electrically conductive terminals which extend from opposite sides of the body. Each of the terminals is bent so that all terminals project in the same direction with two spaced apart parallel rows or series of terminals. Each terminal has a free end portion adapted to make electrical contact and is preferably of a narrow flat configuration. The base or socket for mounting the microelement for selective external electrical connection and electrical interconnection of its terminals is constructed of insulating material and has a plurality of electrically conductive connectors at least partially exposed at a top surface of the base member or socket.

The connectors are engageable at one end portion in electrically conductive contact with the free end portions of the terminals of the microelement when the microelement is positioned on the top surface of the base with the terminals projecting downwardly. The opposite end portions of the connectors extend upwardly and ar exposed and accessible for electrical connection at the same side of the base on which the microelement is supported. Preferably, the connectors have free end portions projecting upwardly beyond the microelement with "quick connect" provisions in the form of narrow slots for self-stripping engagement with small diameter insulated electrical wire. Thus, experimental and other wiring operations may be accomplished quickly and easily through the interconnection of connectors and their associated terminals and/or the connection of terminals via connectors with external circuit elements.

Preferably, the terminals and the said one end portions of the connectors are adapted for firm frictional interengagement so as to provide for the establishment and maintenance of good electrical contact therebetween and also to retain the microelement in position on the top surface of the base.

BRIEF DESCRIPTION OF THE DRAWINGS

FIG. 2 is a perspective view showing the assembly of the electronic circuit microelement and the base.

FIG. 3 is a vertical sectional view taken generally along line 3—3 in FIG. 2.

FIG. 4 is a vertical sectional view similar to FIG. 3 but showing an alternative embodiment of the present invention.

FIG. 5 is a front view of a terminal block which may be employed with the microelement and base assembly of the present invention.

FIG. 6 is a vertical sectional view through the terminal block of FIG. 5.

DESCRIPTION OF PREFERRED EMBODIMENTS

Figure 1:
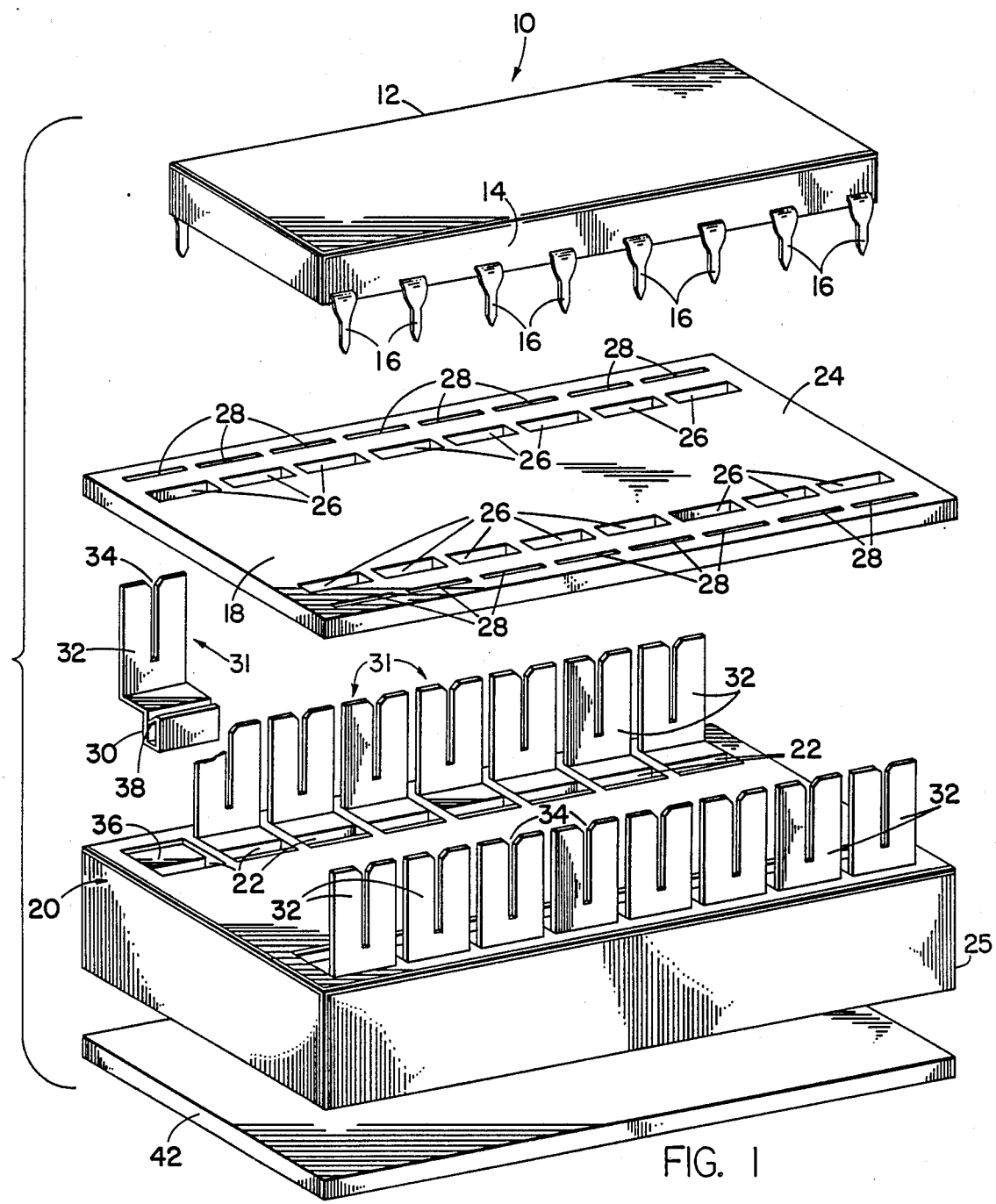
FIG. 1 is an exploded view in perspective showing the assembly comprising the electronic circuit microelement and the base therefore with its parts including a top plate and a main body portion and the electrically conductive connectors.

Referring particularly to FIG. 1, it will be observed that a microelement indicated generally at 10 takes the form of a simple rectangular parallelpiped with a body of insulating material encapsulating a chip etc. Opposite sides thereof 12, 14, the longer sides in FIG. 1, each have a series of leads or terminals 16, 16 projecting therefrom. The leads or terminals 16, 16 are shown projecting through the sides of the body of the microelement 10 in opposite directions and are bent through approximately 90°. Thus, as best illustrated in FIGS. 1 and 3, the terminals 16, 16 extend in the same direction and form two spaced apart parallel series or rows of terminals. Each terminal 16 is shown as having a relatively broad base with a narrower free end portion and, more particularly, each terminal may have a generally V-shaped free end portion. The terminals are preferably of a flat construction with opposite flat surfaces thereof readily engageable for good electrical contact. As is well known, the active circuit elements within the body 10 of the microelement may be interconnected by means of the leads or terminals 16, 16. That is, the terminals may be interconnected and/or connections may be effected between the terminals and external circuit elements.

Referring now to FIG. 2, it will be observed that the microelement 10 is disposed on an upper flat surface 18 of a base 20 and is flatly in engagement therewith. The microelement 10, as shown in FIG. 2, has its terminals 16, 16 projecting downwardly and, as best illustrated in FIG. 3, the terminals are entered in recesses 22, 22 formed in a main or body portion of the base 20. The base 20 is preferably formed in two parts with a top plate 24 which may be adhesively mounted on a body portion 25 and which defines the aforementioned top surface 18 on which the microelement 10 is mounted.

As best illustrated in FIG. 1, the top plate 24 is provided with two rows or series of openings 26, 26 in parallel and spaced apart relationship. The openings respectively receive the terminals 16, 16 in downward passage therethrough when the microelement 10 is disposed on the surface 18 atop the plate 24. Thus, the terminals 16, 16 project downwardly through the openings or slots 26, 26 and enter the recesses 22, 22 in the body portion of the base 20. A second row of slots 28, 28 has each slot disposed outwardly of an associated slot in the rows of slots 26, 26. As shown, there are eight (8) slots 28, 28 in each row with an equal number of terminals 16, 16 for entry in the slots 26, 26.

Referring again to FIG. 3 it will be observed that each of the recesses 22, 22 receives a lower or rear end portion 30 of a connector indicated generally at 31 with the rear end portion of the connector being held in position by the lower surface of the top plate 24. That is, with the rear end portions of the connectors 31, 31 entered in the recesses 22, 22 and with the free end portions 32, 32 projecting upwardly through the slots 28, 28 in the top plate 24, the horizontal portion of the plate 24 between the slots 26, 26 and 28, 28 serves to retain the connectors 31, 31 in position. Shoulders or seats 36, 36 formed on the base 20 serve to support portions of the connectors 31, 31 and the top plate 24, engages upper portions of the connectors opposite the seats 36, 36 to hold the connectors in position as illustrated.

As will be observed, upper portions of the connectors 31, 31 are in exposed positions and are readily accessible for making electrical connections thereto. Preferably and as illustrated, each upper portion of a connector 31 is provided with a narrow slot as illustrated at 34. Each of the slots 34, 34 has a narrow upwardly projecting mouth which is slightly widened and the slots may be readily employed in connecting small diameter insulated wire as illustrated in FIG. 2. That is, insulated wire entered transversely downwardly in the slots 34, 34 engages the connectors 31, 31 in a "self-stripping" operation, the slots 34, 34 being narrower than the wire outer diameter to perform the stripping operation. As mentioned, the wire may be employed in interconnecting connectors and their associated terminals or in effecting connection of the connectors and their associated terminals with external circuit elements.

Preferably and as shown, rear portions 30, 30 of the connectors are bent back upon themselves in generally U-shaped configurations and each such connector portion is provided with small tang 38. Each tang 38 is preferably inclined across its associated recess 22 and downwardly relative to the mouth of the recess. Thus, each tang defines, with an opposing wall of the rear end portion 30 of its connector, a narrow slot which is of a lesser dimension than the thickness of an associated terminal 16. Accordingly, when a free end portion of a terminal 16 is urged downwardly into a recess 22 as illustrated in FIG. 3, the tang 38 is engaged and flexed slightly and remains in firm frictional engagement with the terminal. The flexing of the tang 38 urges the terminal 16 into firm frictional and electrical contact with the opposing wall portion of the rear end portion 30 of the connector and good electrical contact is thus achieved on opposite surfaces of the terminal 16. The frictional engagement of the rear portions of the connectors including the tangs 38, 38 with the free end portions of the terminals not only maintains the necessary firm electrical contact and also retains the microelement 10 in position atop the base 20.

The base 20 is preferably also provided with an adhesive means opposite its top plate and a separate adhesive carrying base plate may be provided as illustrated at 42. The base plate 42 may be provided with an adhesive means on its bottom surface and may of course be employed in securing the base and the assembled microelement on a circuit board or other flat surface.

Referring now to the manufacture and assembly of the base parts, it will be apparent in FIG. 1 that the connectors 31, 31 may be readily inserted into the recesses 22, 22 in the base portion 25. Thereafter, top plate 24 may be carefully lowered into position thereabove with the free end portions 32, 32 projecting upwardly through the slots 28, 28. The top plate may be secured in position as by means of an adhesive or other connecting means. The base may thereafter be employed in mounting and effecting electrical connections for various microelements as in the case of the microelement 10. A base plate 42 may of course be adhesively connected to the base portion 25 and similarly adhesively connected at its bottom surface to a printed circuit board etc.

As will be apparent from the foregoing, the free end portions 32, 32 of the connectors are exposed and extend upwardly beyond the microelement 10. Thus, as best illustrated in FIG. 2, experimental wiring may be readily and conveniently accomplished and the operator may observe indicia on top of the microelement 10 while effecting the connections between connectors. It is wholly unnecessary to reverse a circuit board in order first to view microelement and indicia thereon and thereafter to effect the desired connections between connectors on an opposite side of the board.

A microelement and base assembly illustrated in FIG. 4 includes a base similar to that described above but of an improved construction. A lower portion 40 of the base may be adapted for adhesive mounting at a bottom surface and includes a plurality of small recesses 43, 43 arranged in linear series and in parallel relationship with each other as in the case of the recesses 22, 22 above. The base lower portion 40 of the base also includes at least one and preferably two post openings 44, 44, one at each end of the member.

An upper portion 46 of the base includes at least one and preferably a pair of posts 48, 48 which mate with the openings 44, 44 in the lower portion 40 and which are preferably press fitted in to the openings for secure attachment of the upper and lower base portions. There may also be an adhesive connection between the upper and lower portions with each portion preferably being constructed of an insulating thermoplastic or the like.

Adjacent each of the recesses 43, 43 is a shallow horizontally extending groove 50, 50 which projects outwardly from its associated recess and which communicates with a small vertical opening 52 in the upper portion of the base.

As will be apparent, a lower portion of 54 of a connector 56 may be entered in a recess 43 with an intermediate portion 58 thereof extending horizontally in a groove 50 and an upper portion 60 extending upwardly through the opening 52 and to an exposed position above a microelement 62 mounted on top the upper portion 46 of the base. Each upper connector portion 60 is preferably bifurcated to provide for self stripping operation with a small insulated electrical wire as in the microelement bases described above. Further, each lower connector portion 54 is preferably provided with tang 64 for firm frictional contact with a terminal 66 entered downwardly in the recess 43 and connected at an upper end portion with the microelement 62.

A shallow depression 68 has upwardly and outwardly inclined sidewalls 72, 72 to provide for the downward entry and guiding operation of a microelement 62 with the terminals of the microelement entering accurately into the recesses 43, 43 for electrically conductive engagement with connectors 56, 56. Further, it should be apparent that an enlarged microelement or component carrier indicated generally in broken line at 74 maybe mounted atop the surface of the upper base portion 46 extending beyond the margins of the depression 68.

In FIGS. 5 and 6, a terminal block assembly is illustrated for connection of the small insulated wires above to a somewhat heavier insulated wire as for example wire of the type commonly known as "speaker" wire. Interconnections may of course be made for any appropriate purpose between the wires of the microelement and base assembly and external elements through the terminal block.

A terminal block indicated generally at 78 includes a lower or base unit 80, an upper unit 82, a front top plate 84 and a rear connecting bracket 86 best illustrated in FIG. 6. The terminal block shown includes a pair of connectors 88, 88 but there may of course be more or less connectors in accordance with requirements. Each connector 88 has a vertically upwardly projecting bifurcated front end portion 90, a horizontally rearwardly extending portion 92, and a rear end portion, as best illustrated in FIG. 6, the connector portion 92 engages the lower portion of the bracket 86 which is electrically conductive and which has an upper portion thereof adapted to engage a heavier gauge wire as at 94. As mentioned, the wire 94 may be used for any suitable connection.

At an upper portion of the bracket 86 a suitably threaded opening 96 is provided for reception of a small binder screw 98 which is entered downwardly therethrough and which engages the wire 94 at a lower end portion. As will be apparent the binder screw 98 may be appropriately tightened to engage a wire 94 and to establish selective electrical connection from the wire through the lower portion of the block 78 to the rear portion 92 of the connector 88.

As will be apparent from the foregoing, the FIG. 4 microelement and base assembly construction as well as the terminal block assembly of FIGS. 5 and 6 have in common the ease and convenience of use with the above described microelement and base assembly of FIGS. 1 to 3. The terminal block of FIGS. 5 and 6 may be adhesively attached at the lower surface to a surface adjacent a microelement and base assembly whereupon experimental or other wiring can be carried out efficiently and without "flip flopping" of any of the elements.

I claim:

1. An assembly comprising an electronic circuit microelement having a body of insulating material which houses active circuit elements and also having a plurality of similar electrically conductive terminals which extend from opposite sides of the body, each of said terminals being bent so that the terminals project in two spaced apart parallel series in the same direction, and each terminal having a free end portion adapted to make electrical contact, a base for mounting the microelement for selective external electrical connection and for electrical interconnection of its terminals, said base being of insulating material and having two spaced apart parallel series of upwardly open recesses its top surface, an associated plurality of electrically conductive connectors each with a free end portion projecting upwardly from the top surface of the base and with a lower end portion, said lower end portion being received respectively in an upwardly open recess in the base, the bottom surface of said base being substantially flat and continuous, and said connectors being engageable in electrically conductive contact respectively with said free end portions of said terminals when the microelement is positioned on said top surface of the base with the terminals projecting downwardly into said recesses in the base, and said upwardly projecting free end portions of said connectors being of sufficient length as to be readily accessible for electrical connection above the top surface of the microelement mounted on the base.

2. An assembly as set forth in claim 1 wherein each terminal and each connector is adapted for firm frictional interengagement in a respective recess so as to maintain good electrical contact therebetween.

3. An assembly as set forth in claim 2 wherein the frictional engagement between the terminals and connectors also serves to maintain the microelement in position on said top surface of the base.

4. An assembly as set forth in claim 1 wherein each connector free end portion has a narrow slot which opens upwardly and which is dimensioned to receive a portion of a small insulated electrically conductive wire in a self-stripping entry of the wire in the slot.

5. An assembly as set forth in claim 1 wherein each connector lower end portion has a small flexible tang which is bent slightly when engaged by the descending free end portion of a corresponding terminal and which thereafter remains in firm frictional engagement with a portion of the terminal.

6. An assembly as set forth in claim 5 wherein each small tang is inclined at an angle extending across and downwardly from the mouth of its associated recess so as to frictionally engage and tend to prevent withdrawal of an associated terminal.

7. An assembly as set forth in claim 6 wherein a lower end portion of each of said connectors is bent back upon itself in a generally U-shaped configuration to define a narrow entry slot between the end of its tang and an adjacent wall surface, the entry slot being narrower than the thickness of the free end portion of an associated terminal, and the tang being bent slightly on entry of the free end portion of an associated terminal so as to frictionally retain the associated terminal.

8. An assembly as set forth in claim 7 wherein the base is constructed in two parts with a main body and a top plate, the main body having recesses therein for receiving said lower end portions of connectors and the top plate having openings therethrough which are in alignment with the recesses when the top plate is assembled to the base, the upper surface of the top plate forming said top surface of the base and said lower surface of the plate securing the lower end portions of the connectors in the respective recesses of the main body.

* * * * *